(12) United States Patent
Bauer et al.

(10) Patent No.: US 10,175,324 B2
(45) Date of Patent: Jan. 8, 2019

(54) MAGNETIC RESONANCE IMAGING APPARATUS AND METHOD FOR CONTROL THEREOF

(71) Applicant: Siemens Aktiengesellschaft, Munich (DE)

(72) Inventors: Simon Bauer, Baunach (DE); Swen Campagna, Engelthal (DE); Uvo Hoelscher, Erlangen (DE); Daniel Niederloehner, Erlangen (DE); Dominik Paul, Bubenreuth (DE)

(73) Assignee: Siemens Aktiengesellschaft, Munich (DE)

( * ) Notice: Subject to any disclaimer, the term of this patent is extended or adjusted under 35 U.S.C. 154(b) by 355 days.

(21) Appl. No.: 14/995,393

(22) Filed: Jan. 14, 2016

(65) Prior Publication Data

US 2016/0209484 A1 Jul. 21, 2016

(30) Foreign Application Priority Data

Jan. 19, 2015 (DE) ........................ 10 2015 200 695

(51) Int. Cl.
| | |
|---|---|
| *G01R 33/36* | (2006.01) |
| *G01R 33/58* | (2006.01) |
| *G01R 33/565* | (2006.01) |
| *G01R 33/3875* | (2006.01) |
| *G01R 33/24* | (2006.01) |
| *G01R 33/54* | (2006.01) |

(52) U.S. Cl.
CPC ......... *G01R 33/543* (2013.01); *G01R 33/243* (2013.01); *G01R 33/583* (2013.01); *G01R 33/3664* (2013.01); *G01R 33/3875* (2013.01); *G01R 33/56563* (2013.01)

(58) Field of Classification Search
CPC .. G01R 33/543; G01R 33/243; G01R 33/583; G01R 33/3664; G01R 33/3875; G01R 33/56563
USPC .................................................. 324/300–322
See application file for complete search history.

(56) References Cited

U.S. PATENT DOCUMENTS

| | | | | |
|---|---|---|---|---|
| 4,899,109 A | * | 2/1990 | Tropp ................ | G01R 33/3875 324/319 |
| 5,910,728 A | | 6/1999 | Sodickson | |
| 6,414,488 B1 | * | 7/2002 | Chmielewski ..... | G01R 33/3657 324/311 |
| 6,822,444 B2 | * | 11/2004 | Lai ....................... | G01R 33/441 324/300 |
| 7,138,800 B1 | * | 11/2006 | Maier ................ | G01R 33/3854 324/309 |

(Continued)

*Primary Examiner* — Patrick Assouad
*Assistant Examiner* — Sean Curtis
(74) *Attorney, Agent, or Firm* — Schiff Hardin LLP

(57) ABSTRACT

In a magnetic resonance (MR) imaging apparatus and control method therefor, multiple frequency spectra of a material of the examination object are detected using at least one radio-frequency coil of and MR scanner, the coil having a number of coil elements and at least two of the frequency spectra are detected individually by respective, different coil elements. A number of resonant frequencies of at least one molecule in the material are established in the number of frequency spectra. Control information is formulated based on the number of resonant frequencies. The magnetic resonance scanner is controlled using the control information.

13 Claims, 3 Drawing Sheets

(56) References Cited

U.S. PATENT DOCUMENTS

| | | | | |
|---|---|---|---|---|
| 7,239,140 B1* | 7/2007 | Maier | G01R 33/56341 | 324/309 |
| 7,420,368 B2* | 9/2008 | Miyazaki | G01R 33/4828 | 324/307 |
| 7,603,157 B2* | 10/2009 | Feiweier | G01R 33/5659 | 324/307 |
| 8,115,485 B1* | 2/2012 | Maier | G01R 33/543 | 324/307 |
| 8,232,799 B2* | 7/2012 | Hajian | G01R 33/56 | 324/309 |
| 8,283,926 B2* | 10/2012 | Teughels | B82Y 15/00 | 324/316 |
| 8,542,014 B2* | 9/2013 | Teughels | B82Y 15/00 | 324/306 |
| 8,659,295 B2* | 2/2014 | Jellus | G01R 33/5601 | 324/309 |
| 9,084,819 B2* | 7/2015 | Zabow | A61B 5/055 | |
| 9,097,779 B2* | 8/2015 | Fautz | G01R 33/5605 | |
| 9,599,691 B2* | 3/2017 | Paul | G01R 33/34092 | |
| 9,632,159 B2* | 4/2017 | Paul | G01R 33/5607 | |
| 9,651,644 B2* | 5/2017 | Feiweier | G01R 33/563 | |
| 9,658,299 B2* | 5/2017 | Paul | G01R 33/481 | |
| 9,662,037 B2* | 5/2017 | Takahashi | A61B 5/055 | |
| 9,739,859 B2* | 8/2017 | Bachschmidt | G01R 33/4828 | |
| 9,841,478 B2* | 12/2017 | Paul | G01R 33/32 | |
| 9,851,424 B2* | 12/2017 | Shirai | G01R 33/4804 | |
| 2004/0004477 A1* | 1/2004 | Nesteruk | G01R 33/285 | 324/318 |
| 2005/0083054 A1* | 4/2005 | Feiweier | G01R 33/5659 | 324/307 |
| 2007/0229075 A1* | 10/2007 | Ookawa | G01R 33/5616 | 324/318 |
| 2009/0160442 A1* | 6/2009 | Mazurkewitz | G01R 33/34046 | 324/318 |
| 2010/0001725 A1* | 1/2010 | Van Liere | G01R 33/3621 | 324/307 |
| 2010/0271023 A1 | 10/2010 | Deimling | | |
| 2011/0014129 A1* | 1/2011 | Zabow | A61B 5/055 | 424/9.34 |
| 2012/0013336 A1 | 1/2012 | Hetzer et al. | | |
| 2012/0119740 A1 | 5/2012 | Takahashi et al. | | |
| 2012/0176131 A1* | 7/2012 | Madhuranthakam | G01R 33/4828 | 324/307 |
| 2013/0249550 A1* | 9/2013 | Feiweier | G01R 33/563 | 324/309 |
| 2013/0265048 A1* | 10/2013 | Kalechofsky | A61B 5/055 | 324/309 |
| 2014/0077802 A1* | 3/2014 | Bachschmidt | G01R 33/4828 | 324/307 |
| 2014/0247047 A1* | 9/2014 | Kalechofsky | A61B 5/055 | 324/309 |
| 2014/0361776 A1* | 12/2014 | Miyazaki | G01R 33/5605 | 324/322 |
| 2015/0008925 A1* | 1/2015 | Shirai | G01R 33/4804 | 324/318 |
| 2015/0177354 A1* | 6/2015 | Bachschmidt | G01R 33/56536 | 324/309 |
| 2015/0185305 A1* | 7/2015 | Paul | G01R 33/32 | 324/309 |
| 2015/0226822 A1* | 8/2015 | Campagna | G01R 33/583 | 324/309 |
| 2015/0293194 A1* | 10/2015 | Kalechofsky | G01R 33/48 | 600/410 |
| 2016/0033597 A1* | 2/2016 | Gong | G01R 33/3664 | 324/307 |
| 2016/0084930 A1* | 3/2016 | Paul | G01R 33/4818 | 324/309 |
| 2016/0091578 A1* | 3/2016 | Schoessow | G01R 33/3614 | 324/309 |
| 2016/0161580 A1* | 6/2016 | Shirai | A61B 5/055 | 324/322 |
| 2016/0209484 A1* | 7/2016 | Bauer | G01R 33/543 | |
| 2016/0238683 A1* | 8/2016 | Campagna | G01R 33/4625 | |
| 2016/0274156 A1* | 9/2016 | Niederloehner | G01R 23/16 | |
| 2016/0291108 A1* | 10/2016 | Niederloehner | G01R 33/4828 | |
| 2017/0242085 A1* | 8/2017 | Koehler | G01R 33/443 | |
| 2017/0261586 A1* | 9/2017 | Carinci | G01R 33/3628 | |
| 2017/0261587 A1* | 9/2017 | Carinci | G01R 33/543 | |
| 2017/0293010 A1* | 10/2017 | Bhat | G01R 33/5611 | |

* cited by examiner

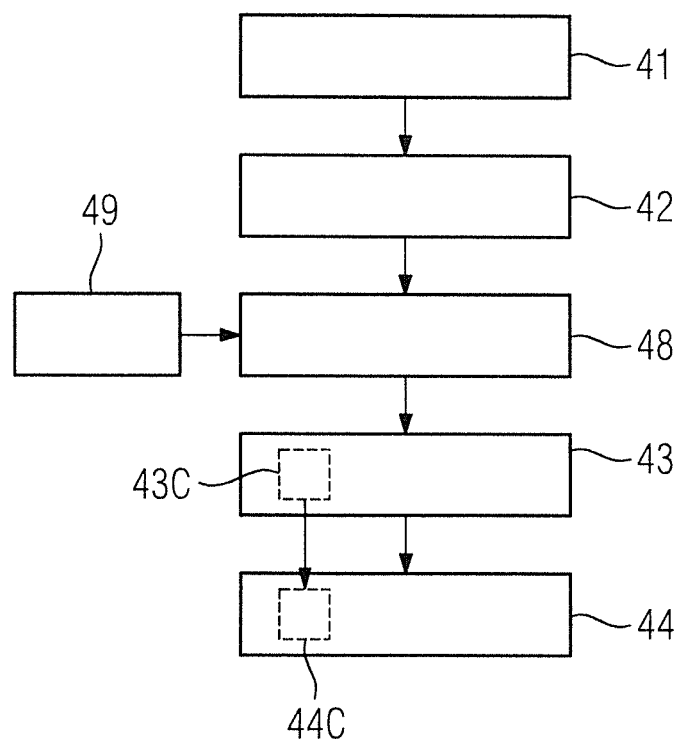

MAGNETIC RESONANCE IMAGING APPARATUS AND METHOD FOR CONTROL THEREOF

BACKGROUND OF THE INVENTION

Field of the Invention

The invention concerns a method for controlling a magnetic resonance apparatus for magnetic resonance imaging, a magnetic resonance apparatus controlled by such a method, and a non-transitory, computer-readable data storage medium encoded with programming instructions that cause a control computer of a magnetic resonance apparatus to execute such a method.

Description of the Prior Art

In a magnetic resonance apparatus, also referred to as a magnetic resonance tomography system, the body of a person to be examined, such as is planned in a scanner wherein the body of a patient, is exposed by the operation of a basic field magnet to a strong basic magnetic field, for example of 1.5 or 3 or 7 Tesla. In addition gradient fields are applied by a gradient coil arrangement. Radio-frequency radio-frequency pulses, namely excitation pulses, are radiated by a suitable antenna arrangement, which cause nuclear spins of specific atoms that are resonantly excited by these radio-frequency pulses to be flipped by a defined flip angle with respect to the magnetic field lines of the basic magnetic field. During the relaxation of the nuclear spin, radio-frequency signals, so-called magnetic resonance signals, are emitted, which are received by suitable reception antennas, and are then further processed. The desired image data can be reconstructed from the raw data thus acquired.

For a specific magnetic resonance measurement, a specific magnetic resonance sequence, also known as a pulse sequence, is to be radiated, which includes a sequence of radio-frequency (RF) pulses, for example excitation pulses and refocusing pulses, as well as gradient pulses coordinated to match the RF pulses, on different gradient axes in different spatial directions. Readout windows matching these pulses in time are set, which predetermine the periods of time in which the induced magnetic resonance signals are detected.

During the acquisition of such raw data, for the homogeneity of the basic magnetic field in an examination volume of the scanner is of great significance. Even small deviations in the homogeneity can result in large deviations in a frequency distribution of the nuclear spin, so that the acquired magnetic resonance data are of lower quality.

Adjustments, which are specific for the examination object from which the magnetic resonance signals are detected, are typically carried out before a magnetic resonance measurement. A typical adjustment is a frequency adjustment in which a resonant frequency is established in an examination volume of the magnetic resonance measurement. Usually in such cases the resonant frequency is established from protons bound in water. The frequency adjustment is of advantage because the examination object, which is positioned in the patient receiving area of the scanner, can disturb the basic magnetic field in the scanner, and thus can influence the resonant frequency globally and/or locally. By the frequency adjustment, a system frequency of the scanner can be tuned to the examination object. The frequency adjustment in such cases can be an adjustment of a frequency for a radiation of the radio-frequency pulses and/or the read-out of the magnetic resonance signals. In this way the frequency adjustment can insure that the magnetic resonance data acquisition takes place at the respective Larmor precession frequency of the protons.

SUMMARY OF THE INVENTION

An object of the invention is to allow magnetic resonance imaging to be tuned to resonant frequencies of at least one molecule.

The inventive method for controlling a magnetic resonance apparatus, namely the scanner thereof, to acquire data for magnetic resonance imaging of an examination object, has the following method steps.

Multiple frequency spectra of a material of the examination object are detected using at least one radio-frequency coil of the magnetic resonance scanner, the at least one radio-frequency coil having multiple coil elements and at least two frequency spectra of the multiple frequency spectra are individually detected respectively by different coil elements of the multiple coil elements.

Multiple resonant frequencies of at least one molecule in the multiple frequency spectra are established, and control information is generated on the basis of the multiple resonant frequencies that have been established. The magnetic resonance scanner is controlled on the basis of this control information.

The examination object can be a patient, a training person or a phantom. The magnetic resonance scanner can be controlled such that magnetic resonance raw data are detected from the examination object. The detected magnetic resonance raw data are then converted into image data that are made available, i.e. displayed, to a user on a display monitor and/or stored in a database.

The multiple frequency spectra are typically detected as part of a frequency adjustment before acquisition of the diagnostic magnetic resonance data from the examination object. For detection of the frequency spectra, there is typically a readout of adjustment magnetic resonance measurement data after an adjustment excitation of the material of the examination object. The material can in such cases be body tissue of the examination object. The material can be localized in an imaging area, preferably the isocenter, of the magnetic resonance scanner. The adjustment magnetic resonance measurement data can then, by a Fourier transformation for example, be converted into frequency spectra. The frequency spectra are embodied in such cases as functions dependent on the frequency. The frequency spectra in such cases can represent an overlaying of individual module frequency spectra of a number of molecules.

The radio-frequency coil is designed for detection of the magnetic resonance signals from which the multiple frequency spectra are derived. The radio-frequency coil can be a local radio-frequency coil. Such a local radio-frequency coil is usually positioned, for receiving the magnetic resonance signals, in a patient receiving area of the magnetic resonance scanner in the immediate vicinity of the examination object. This enables the local radio-frequency coil to detect the magnetic resonance signals in the vicinity of their point of origin. The local radio-frequency coils may be disposed at different positions on the examination object and can be designed flexibly.

The radio-frequency coil has between 2 and 128 coil elements. Typically a number of radio-frequency coils are employed. The coil elements of the number of radio-frequency coils can be grouped together in such cases into a number of groups, each having a number of radio frequency antennas. Each coil element, also referred to as a coil channel, can represent a radio frequency antenna unit for receiving magnetic resonance signals, as a reception coil or reception unit. The coil elements can be grouped together into groups of a number of coil elements in each case. Each coil element of the radio-frequency coil can contribute, with its individual signal-receiving characteristic, to the signal-receiving characteristic of the overall radio-frequency coil. Thus the number of coil elements has different spatial sensitivities. This means that different coil elements primarily receive magnetic resonance signals from different spatial areas. In a typical recording of magnetic resonance image data by means of the radio-frequency coil, the individual images produced from data sets detected by the individual coil elements are usually grouped together into an overall image.

By contrast with a conventional method, in which a frequency spectrum is usually detected using all coil elements of the radio-frequency coil, in accordance with the invention, at least two frequency spectra of the multiple frequency spectra are individually detected respectively with different coil elements of the multiple coil elements. It is thus possible that at least two frequency spectra are detected by different configurations of activated coil elements of the multiple coil elements. Thus, during the detection of a first frequency spectrum of the multiple frequency spectra, a first set of coil elements of the number of coil elements can be activated and, during the detection of a second frequency spectrum of the multiple frequency spectra, a second set of coil elements of the multiple coil elements can be activated, with the first set and second set of the coil elements being different (meaning that there will be at least one coil element in one of the cells that is not the other). It is also possible for each frequency spectrum of the multiple frequency spectra to be detected by a different coil element of the multiple coil elements in each case. Thus a first frequency spectrum of the multiple frequency spectra can be detected by a first coil element of the multiple coil elements and a second frequency spectrum of the multiple frequency spectra can be detected by a second coil element of the multiple coil elements. This can of course be extended to any given number of coil elements, so that a number of frequency spectra, which is equal to the number of the coil elements, are detected. When a number of radio-frequency coils are used for detection of the number of frequency spectra, the number of coil elements can be distributed between the number of radio-frequency coils.

Then one resonant frequency of the at least one molecule is established in each case in one frequency spectrum of the multiple detected frequency spectra. Thus the quantity of the number of resonant frequencies can be equal to the quantity of the number of frequency spectra. As an alternative, it is also possible for the resonant frequency of the at least one molecule to be determined in only some of the detected frequency spectra. Different values for the resonant frequency of the at least one molecule are defined in different frequency spectra. One reason for this is that, typically spatially variable magnetic field strengths of the basic magnetic field of the magnetic resonance scanner lead to spatially variable precession frequencies of the protons. The at least one molecule in such cases preferably is water. Thus a number of water frequencies are preferably determined in the multiple frequency spectra. In specific applications, it is possible for the at least one molecule to be fat or silicon or another material appearing reasonable to those skilled in the art. A resonant frequency of the at least one molecule in a frequency spectrum can be established in such cases by a method known to those skilled in the art, such as detection of local maxima (peak detection). The number of resonant frequencies of the at least one molecule are established independently of one another in the multiple frequency spectra.

The resonant frequencies of the at least one molecule determined separately for the number of coil elements of the at least one radio-frequency coil can then represent an advantageous starting point for the generation of the control information in order to control the scanner of the magnetic resonance apparatus. The control information can be formulated such that control of the magnetic resonance scanner with the control information compensates at least in part for the influence of a nonhomogeneous distribution of the basic magnetic field of the scanner (B0 distribution) on magnetic resonance measurement data recorded by operation of the scanner. In this way, as described below, control information for a frequency adjustment of the magnetic resonance scanner can be generated on the basis of the number of resonant frequencies. As an alternative or in addition to as also described below, information about the homogeneity of the basic magnetic field is derived on the basis of the number of resonant frequencies. Then on the basis of this information, control information can be derived for a shimming procedure, which preferably leads to an improvement in the homogeneity of the basic magnetic field.

The inventive method can provide the advantage of making it possible to reliably determine the actual resonant frequency of the at least one molecule in the magnetic resonance scanner. For this purpose, the number of established resonant frequencies can be merged, as described below, into one resulting resonant frequency. The individual resonant frequencies, which are established in the individual frequency spectra, can in such cases be determined more reliably, since fewer overlay effects occur. The reliable determination of the resonant frequency of the at least one molecule can make possible an especially marked fat suppression or a precise localization of a measurement volume. Moreover, in a conventional method, frequency adjustment based on an individual resonant frequency of the at least one molecule is carried out. The individual resonant frequency in this case is determined in the conventional method typically in an individual frequency spectrum, which may arise from an overlaying of the number of frequency spectra of the number of coil elements. Spatial effects, for example a spatially variable tissue distribution of the examination object and/or a spatially nonhomogeneous B0 distribution, can in such cases make it more difficult in a conventional method to determine the actual resonant frequency of the at least one molecule for the frequency adjustment.

The inventive method also provides the advantage of information about the homogeneity of the basic magnetic field being obtained on the basis of the number of resonant frequencies that are established. The basis underlying this option is that the number of coil elements of the at least one radio-frequency coil typically has different spatial reception characteristics. In this way, by use of the proposed method, the number of resonant frequencies of the at least one molecule are established in different spatial regions of the examination object. Information about the homogeneity of the basic magnetic field can be established particularly easily in this way, particularly at the same time as a frequency adjustment. An additional measurement of the homogeneity of the basic magnetic field can be dispensed with completely under some circumstances.

Information about the spatial distribution of the number of coil elements can be included in the detection of the number of frequency spectra and/or the establishment of the number of resonant frequencies. Thus the frequency spectra detected by means of neighboring coil elements can be averaged and the resonant frequencies can be determined in the averaged frequency spectra. As an alternative or in addition, it is possible for a frequency spectrum from respective defined regions, which may have a weak signal strength, to be included.

In an embodiment, the multiple resonant frequencies are merged into one resulting resonant frequency of the at least one molecule, and the generation of the control information includes a formulation of control information for a frequency adjustment for the magnetic resonance imaging using the resulting resonant frequency. The number of resonant frequencies can be merged, for example, by a weighted sum, especially a magnitude-weighted sum, applied to the resulting resonant frequency. Naturally other procedures for merging the number of resonant frequencies that are reasonable to those skilled in the art can be used. Thus, all of the resonant frequencies established can be included in this way in the resulting resonant frequency. The presence of a number of resonant frequencies of the at least one molecule advantageously makes possible a determination of the resulting resonant frequency of the at least one molecule for the frequency adjustment by the use of a sophisticated series of algorithms, which can be adapted to the respective situation. The resulting resonant frequency, which is determined on the basis of the number of resonant frequencies, can correspond especially precisely to the actual resonant frequency of the at least one molecule. The resonant frequency can be determined on the basis of the inventive method more precisely than if the resonant frequency were determined in a resulting frequency spectrum, which represents a superior position of the multiple frequency spectra. The effect of the overlaying of the number of frequency spectra can be separated by the inventive method even during the determination of the multiple resonant frequencies. On the basis of the resulting resonant frequency thus established, an especially precise frequency adjustment of the magnetic resonance scanner can be made. To this end the control of the magnetic resonance device can include carrying out the frequency adjustment with the resulting resonant frequency as an adjustment frequency.

In another embodiment the control information is based on a distribution of values of the number of resonant frequencies, for a measure of the homogeneity of the basic magnetic field of the magnetic resonance scanner to be determined. This embodiment is based on the consideration that the local resonant frequency of the at least one molecule is dependent on a local field strength of the basic magnetic field of the magnetic resonance scanner. Thus, the resonant frequency of the at least one molecule measured by a coil element can provide information about the local field strength of the basic magnetic field in a localized reception area of the corresponding coil element. In this way the number of measured resonant frequencies can provide information about the local field strength of the basic magnetic field at different locations, which depend on the spatial positions of the coil elements in relation to the examination object. In this way a measure of the spatial, homogeneity of the basic magnetic field can be derived from the number of resonant frequencies. To this end, a statistical analysis of the number of resonant frequencies, for example a determination of a standard deviation, can be performed. A stronger distribution of the number of resonant frequencies can provide an indication of a higher spatial inhomogeneity of the basic magnetic field. The basic magnetic field is all the more homogeneous, the less that the number of resonant frequencies are scattered and/or deviate from one another. The multiple resonant frequencies can be respectively weighted in the determination of the measure of the homogeneity of the basic magnetic field. Different options for weighting the multiple resonant frequencies are described below. For example, a weighting of the multiple resonant frequencies with a signal strength of the frequency spectrum underlying the respective resonant frequencies is conceivable. The magnetic resonance scanner can be controlled advantageously on the basis of the measure of the homogeneity of the basic magnetic field determined in this manner. For example, as described below, operator information and/or aborting a measurement by the magnetic resonance scanner are conceivable, if the homogeneity of the basic magnetic field is below a threshold value.

In another embodiment, the control information is formulated on the basis of the measure of the homogeneity of the basic magnetic field so as to include generation of output information for an operator of the magnetic resonance scanner. The control of the magnetic resonance scanner can then include presentation of the output information on an output monitor for operating personnel. The output information can be generated when the measure of homogeneity is too small, meaning that the basic magnetic field is too inhomogeneous. For example the measure of homogeneity can be compared with a threshold value and the output information can be generated and/or emitted as a function of a result of this comparison. The output information can be an alert and/or an instruction for the operating personnel. For example the operating personnel can be automatically notified that, possibly as a result of a low homogeneity of the basic magnetic field, artifact-prone and/or bad results of the magnetic resonance imaging are to be expected. Depending on the measure of the homogeneity of the basic magnetic field for example, a re-positioning of the examination object and/or a repetition of the shim procedure and/or a selection of a magnetic resonance sequence that is less sensitive to the homogeneity of the basic magnetic field can be proposed to the operating personnel. Location-dependent information can also be proposed to the operating personnel. This can mean that the coil elements, for which the resonant frequency of the at least one molecule deviates especially greatly from a resulting average resonant frequency and/or a system frequency, can be determined in one processing step. Based on this processing step, the spatial areas of the examination object in which this high deviation of the field strength of the basic magnetic field is present can be displayed to the operating personnel. It is also conceivable for the user to specify a volume of interest to them and for the resonant frequency only to be determined for those coil elements that receive magnetic resonance signals from this volume of interest with a specific signal strength and/or which are closest to this volume of interest. The image quality can then be optimized for the volume of interest. Overall, on the basis of the automatically established measure of the homogeneity of the basic magnetic field, especially meaningful output information can be provided for the operating personnel, on the basis of which the operating personnel can take suitable measures, such as to improve image quality.

In another embodiment, the generation of the control information is based on the measure of the homogeneity of the basic magnetic field determined so as to generate shim control information for the magnetic resonance data acquisition. Electrical shim coils can be activated by this shim control information. The electrical shim coils, when shim currents are supplied thereto, can create compensation magnetic fields, in order to improve the homogeneity of the basic magnetic field. Inhomogeneities of the basic magnetic field, such as those induced by the examination object, namely by body tissue of the examination object, can be at least partly compensated. In a conventional method, a separate measurement is needed to identify the field distribution of the basic magnetic field, by producing a so-called B0 map, when the examination object has been introduced into a patient receiving area of the magnetic resonance device. Thereafter shim settings are established by a control unit, taking into account the measured field distribution. The shim coils are then activated using the shim settings. This described process is known as a shim procedure. The shim procedure for the magnetic resonance imaging of the examination object can be controlled by the generated shim control information. The magnetic resonance scanner can thus be controlled by the shim control information. For example, the shim control information can be a specification about whether a shim procedure is to be carried out or not. If the determined measure of the homogeneity of the basic magnetic field is less than a threshold value, then the shim control information can cause a possibly new shim procedure to be performed. If the determined measure of the homogeneity of the basic magnetic field is greater than the threshold value, then the shim control information can define that a, possibly renewed, shim procedure is not necessary. As an alternative or in addition the shim control information can define parameters for the shim procedure. For example, the shim control information can define a number of iterations of the shim procedure. For example, in the event of a higher homogeneity of the basic magnetic field, the number of iterations of the shim procedure can be reduced, which makes it possible to save time during the measurement. The shim control information can also directly designate shim settings for the shim coils, as described below. Solely on the basis of the number of resonant frequencies of the multiple coil elements that are established, the shim procedure can be controlled advantageously by the shim control information. An automated execution sequence is made possible because the measure of the homogeneity of the basic magnetic field determined can be assessed automatically. In this way, for example, it can be decided automatically whether a shim procedure is necessary, on the basis of the determined measure of the homogeneity of the basic magnetic field. Thus a satisfactory image quality can be insured and/or the measurement time reduced.

In another embodiment, the calculation of the spatial distribution of a strength of a basic magnetic field of the magnetic resonance scanner includes the calculation of information about the spatial arrangement of the number of coil elements. The control information is generated using the calculated spatial distribution of the strength of the basic magnetic field. The spatial distribution of the strength of the basic magnetic field is typically also called a B0 field map or B0 map. The information about the spatial arrangement of the number of coil elements can be measured in advance and/or estimated. For example, the spatial receive volume of a coil element can be a basis for establishing a spatial position of the coil element. As an alternative or in addition a model of the radio-frequency coil, which includes the positions of the coil elements, can be used. It is also conceivable for the information about the spatial arrangement of the number of coil elements to be established in a preceding measurement, for example a normalizing measurement (prescan-normalize measurement) and/or a measurement for selecting the coil element (auto coil select measurement). Information about a local strength of the basic magnetic field for the number of coil elements can be derived from the number of resonant frequencies. This information about the local strength of the basic magnetic field can then be combined with the information about the spatial arrangement of the number of coil elements, in order to obtain the spatial distribution of the strength of the basic magnetic field, the B0 map. The inventive method thus makes it possible to calculate the B0 map automatically. An additional measurement of the B0 map can possibly be omitted, through which measurement time can be saved. In this way the B0 map can namely be calculated directly on the basis of the measurements for the frequency adjustment. The accuracy of the B0 map established in this way is typically related to the spatial distribution and/or a quantity of the number of coil elements. The control information, which is then generated using the B0 map, can then be used, for example, for activation of a shim procedure as shim control information. Thus, on the basis of the calculated B0 map, as described below, shim settings can be calculated for the shim coils of the magnetic resonance scanner. It is thus possible always to perform a shim procedure, solely on the basis of the measurements for the frequency adjustment, without the additional measurement time for recording the B0 map having to be invested. Naturally the calculated B0 map can also be used for other purposes that are meaningful to those skilled in the art.

In another embodiment, the calculation of the spatial distribution of the strength of the basic magnetic field includes an allocation of local magnetic field strengths, calculated from the number of resonant frequencies, to a number of spatial support points that are assigned to multiple of coil elements. The number of spatial support points can be defined using the information about the spatial arrangement of the multiple coil elements. For example, the support points can be focal points of the respective signal intensity distributions of the multiple coil elements. The spatial distribution of the strength of the basic magnetic field can then comprise the local strength of the basic magnetic field, which can be derived from the number of resonant frequencies of the multiple coil elements, at the positions of the spatial support points. The resolution of the calculated spatial distribution of the strength of the basic magnetic field then corresponds, initially, to the spatial distances between the respective spatial support points. The resolution can be increased, for example, by an interpolation between the support points on a grid. In this case the interpolation can be undertaken three-dimensionally linearly, cubically, spline-based, or another method known to those skilled in the art. The spatial support points of the multiple coil elements offer an especially simple option for determining the spatial distribution of the strength of the basic magnetic field from the local field strengths assigned to the multiple coil elements, which can be produced from the resonant frequencies measured by the coil elements.

In another embodiment, the generation of the control information on the basis of the calculated spatial distribution of the strength of the basic magnetic field includes a calculation of shim settings of the magnetic resonance scanner, by which a shim unit of the magnetic resonance scanner is activated during the magnetic resonance data acquisition. The shim unit of the magnetic resonance scanner can be a number of shim coils, and the shim settings can be a number of values for shim currents, with each shim coil being assigned at least one of these shim currents. The shim currents flow through the shim coils of the shim unit when magnetic resonance raw data of the examination object are being recorded by the magnetic resonance scanner. Thus the shim currents can contribute to an increase in a homogeneity of the basic magnetic field. The shim currents, which are applied to the shim coils for recording the magnetic resonance raw data, can form the shim settings. In this way the shim currents can be calculated on the basis of the calculated spatial distribution of the strength of the basic magnetic field using a method known to those skilled in the art. The shim currents can be kept constant during the entire recording of the magnetic resonance raw data. As an alternative, the shim settings can be variable shim currents, which are adapted dynamically during the recording of the magnetic resonance raw data to changing boundary conditions. In this way the shim settings can be established automatically by the inventive method based only on measurements for the frequency adjustment. A separate measurement of the B0 map for establishing the shim settings can be omitted, through which measurement time can be saved. It is conceivable, for refining the B0 map for establishing the shim settings, for a separate measurement still to be carried out in addition to the inventive method.

In another embodiment, during the generation of the control information, the number of resonant frequencies are weighted with weighting factors, wherein at least one weighting factor of at least one resonant frequency of the number of resonant frequencies being determined on the basis of at least one characteristic of the at least one frequency spectrum in which the at least one resonant frequency is established. For example, the number of resonant frequencies can be weighted by the weighting factors when they are merged into the resulting resonant frequency for the frequency adjustment. The number of resonant frequencies also can be weighted in the determination of the measure of the homogeneity of the basic magnetic field. An advantageous characteristic of the at least one frequency spectrum can be the signal strength of the at least one frequency spectrum. This signal strength can be the average signal strength in the maximum signal strength. This enables the at least one weighting factor to be made higher, the higher the signal strength of the at least one frequency spectrum is. Frequency spectra with a small signal or high noise can be filtered out in this way, through which computing time can be saved and/or an erroneous generation of the control information can be avoided. A further possible characteristic of the at least one frequency spectrum can be a quality of an adaptation of a model function to the at least one frequency spectrum for establishing the associated resonant frequency, especially of the detection of the local maxima. The higher the quality of the adaptation, the higher the weighting factor can be set. Further characteristics of the at least one frequency spectrum during the determination of the at least one weighting factor that are meaningful to those skilled in the art can be considered. The use of the weighting factors can make it possible to increase the quality of the generated control information.

The characteristic of the at least one frequency spectrum, in which the at least one resonant frequency is established, can also be analyzed, for determining the at least one weighting factor, in a relation to and/or as a deviation from the characteristic of further frequency spectra. In this case the further frequency spectra can be different to the at least one frequency spectrum. For example, in this way an average signal-to-noise ratio can be determined over all frequency spectra. The weighting factor can then be selected on the basis of a least signal-to-noise ratio, which is produced from the average signal-to-noise ratio. If the at least one frequency spectrum has a smaller signal-to-noise ratio than the least signal-to-noise ratio then the weighting factor can be set to zero or very small.

In another embodiment, during the generation of the control information, the number of resonant frequencies are weighted with weighting factors, wherein at least one weighting factor of at least one resonant frequency of the number of resonant frequencies is determined on the basis of a measure of a deviation of the at least one resonant frequency from further resonant frequencies of the number of resonant frequencies that are different from the at least one resonant frequency. In this way, a falsification of the control information by not taking account of resonant frequencies which deviate especially strongly from other resonant frequencies can be avoided.

In another embodiment, the detection of the number of frequency spectra includes a detection of a first number of frequency spectra and for a second number of resonant frequencies are included in the generation of the control information, wherein the first number is greater than the second number. In this way the respective resonant frequencies will not be included in the generation of the control information for all frequency spectra. The frequency spectra will be detected by coil elements of the at least one radio-frequency coil. Then only those coil elements that actually will be used for a specific measurement by the magnetic resonance scanner will be included in the generation of the control information, especially for a frequency adjustment. the control information thus can be adapted simply for different measurements by the appropriate resonant frequencies being selected in each case. A renewed detection of frequency spectra can be dispensed with and the system frequency of the magnetic resonance device can be adjusted dynamically for different measurements of the examination object in a simple manner.

The inventive magnetic resonance apparatus has a scanner with at least one radio-frequency coil with a number of coil elements and a calculation computer, wherein the calculation computer includes a determination processor, a generation processor and a control processor designed (configured) to carry out an inventive method.

Thus the magnetic resonance apparatus is designed to carry out a method for controlling the magnetic resonance scanner for magnetic resonance data acquisition and imaging of an examination object. The radio-frequency coil is designed for detection of a number of frequency spectra of a material of the examination object, wherein the at least one radio-frequency coil has multiple coil elements, and at least two frequency spectra of the number of frequency spectra are detected by different coil elements of the multiple coil elements. The determination processor is designed to determine a number of resonant frequencies of at least one molecule in the number of frequency spectra. The generation processor is designed to generate control information on the basis of the number of resonant frequencies thus determined. The control processor is designed to control the magnetic resonance scanner on the basis of the control information.

In an embodiment of the magnetic resonance apparatus, the generation processor is designed to merge the number of resonant frequencies to form resulting resonant frequency of the at least one molecule, and the control information is formulated as control information for a frequency adjustment for the magnetic resonance data acquisition using the resulting resonant frequency.

In another embodiment, of the magnetic resonance computer, the generation processor is designed to determine, based on a distribution of values of the number of resonant frequencies, a measure of a homogeneity of the basic magnetic field of the magnetic resonance scanner. The control information is formulated on the basis of the determined measure of the homogeneity of the basic magnetic field.

In another embodiment of the magnetic resonance apparatus, the generation processor is designed to generate the control information on the basis of the defined measure of the homogeneity of the basic magnetic field so as to generate output information for an operator of the magnetic resonance apparatus.

In another embodiment of the magnetic resonance apparatus, the generation processor is designed to generate the control information on the basis of the defined measure of the homogeneity of the basic magnetic field so as to generate shim control information for the magnetic resonance data acquisition.

In another embodiment of the magnetic resonance device the generation processor, is designed to calculate a spatial distribution of the strength of the basic magnetic field of the magnetic resonance scanner, with information about a spatial arrangement of the number of coil elements being included in the calculation of the spatial distribution of the strength of the basic magnetic field. The control information is generated using the calculated spatial distribution of the strength of the basic magnetic field.

In another embodiment of the magnetic resonance apparatus, the generation processor is designed to calculate a spatial distribution of the strength of the basic magnetic field as an allocation of local magnetic field strengths calculated from the number of resonant frequencies to a number of spatial support points, which are assigned to the multiple coil elements.

In another embodiment of the magnetic resonance apparatus, the generation processor and the control processor are designed to generate the control information on the basis of the calculated spatial distribution of the strength of the basic magnetic field as a calculation of shim settings of the magnetic resonance scanner, by which a shim unit of the magnetic resonance scanner is activated during the magnetic resonance data acquisition.

In another embodiment of the magnetic resonance apparatus, the generation processor is designed to weight the number of resonant frequencies with weighting factors in the generation of the control information. At least one weighting factor of at least one resonant frequency of the number of resonant frequencies is determined on the basis of at least one characteristic of the at least one frequency spectrum in which the at least one resonant frequency is established.

In another embodiment of the magnetic resonance apparatus, the generation processor is designed to weight such that the number of resonant frequencies with weighting factors in the generation of the control information, with at least one weighting factor of at least one resonant frequency of the number of resonant frequencies being determined on the basis of a measure of a deviation of the at least one resonant frequency from other resonant frequencies of the number of resonant frequencies.

In another embodiment of the magnetic resonance apparatus, the radio-frequency coil and the generation processor are designed to detect the number of frequency spectra as a detection of a first number of frequency spectra, and a second number of resonant frequencies are included in the generation of the control information, wherein the first number is greater than the second number.

The invention also encompasses a non-transitory, computer-readable data storage medium that can be loaded directly into a memory of a programmable calculation processor of a magnetic resonance apparatus and that has program code for implementing the inventive method when the program code is executed in the calculation processor. This enables the inventive method to be executed rapidly, in an identically-repeatable manner and robustly. The calculation processor must have an appropriate main memory, an appropriate graphics card or an appropriate logic unit for example, so that the respective method steps can be executed efficiently.

Examples of electronically-readable data carriers are a DVD, a magnetic tape or a USB stick on which electronically-readable control information is stored.

The advantages of the inventive magnetic resonance apparatus and the inventive storage medium essentially correspond to the advantages of the inventive method, which have been described in detail above. Features, advantages and alternate embodiments mentioned above are likewise applicable to the other aspects of the invention.

BRIEF DESCRIPTION OF THE DRAWINGS

FIG. 5 is a flowchart of a fourth embodiment of the inventive method.

DESCRIPTION OF THE PREFERRED EMBODIMENTS

Figure 1:
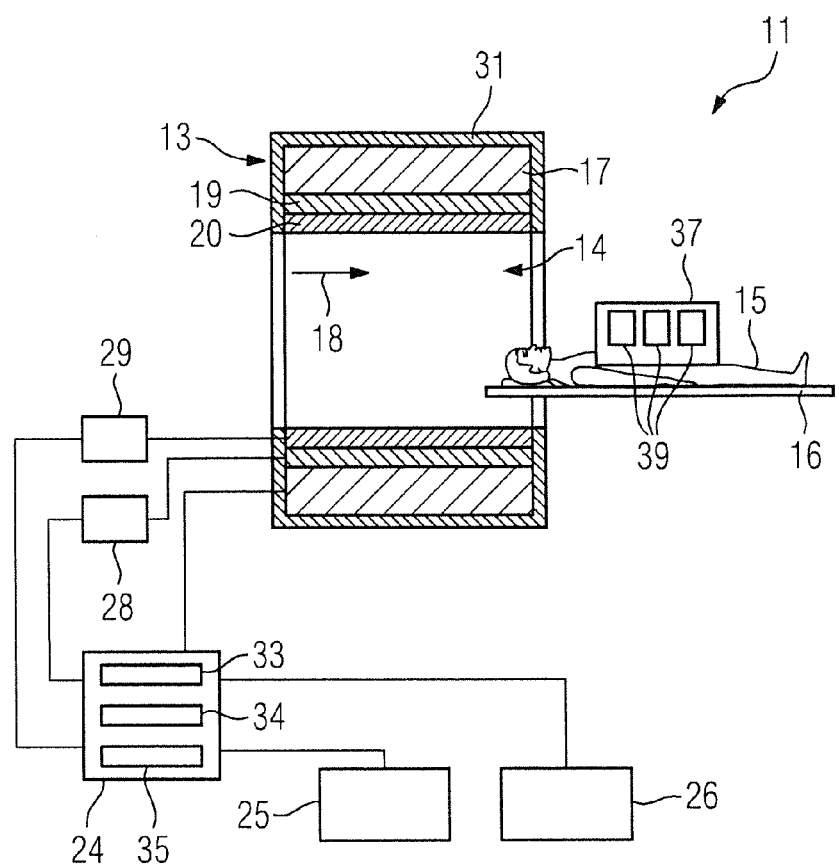
FIG. 1 is a schematic illustration of an inventive magnetic resonance apparatus.

FIG. 1 is a schematic diagram of a magnetic resonance apparatus 11. The inventive magnetic resonance apparatus 11 has a detector unit formed by a scanner 13 with a basic field magnet 17 for creating a strong and constant basic magnetic field 18. The magnetic resonance scanner 13 has a cylindrical patient receiving area 14 for receiving an examination object 15, in the present case a patient. The patient receiving area 14 is surrounded in a circumferential direction by the scanner 13 in a cylindrical shape. The patient 15 can be moved by a patient support 16 of the magnetic resonance apparatus 11 into the patient receiving area 14. The patient support 16 has a support table, which is movable within the scanner 13. The scanner 13 is shielded from the outside by a housing shell 31.

The scanner 13 further has a gradient coil arrangement 19 to create magnetic field gradients, which are used for local encoding during data acquisition. The gradient coil arrangement 19 is activated by a gradient control processor 28. Furthermore the scanner 13 has a radio-frequency antenna unit 20, which, in the case shown, is embodied as a body coil permanently integrated into the scanner 13, and a radio-frequency antenna control processor 29. The radio-frequency antenna unit 20 is operated by the radio-frequency antenna control processor 29 so as to radiate radio-frequency (RF) magnetic resonance sequences into an examination area, which is essentially formed by the patient receiving area 14. The radiated RF energy causes nuclear spins on the patient 15 to deviate from the polarization established by the basic magnetic field 18. Upon relaxation of the excited nuclear spins, they emit RF signals (magnetic resonance signals). The radio-frequency antenna 20 is further embodied for receiving such magnetic resonance signals.

For control of the basic field magnet 17, the gradient control processor 28 and the radio-frequency antenna control processor 29, the magnetic resonance apparatus 11 has a calculation computer 24. The calculation computer 24 centrally controls the magnetic resonance scanner 13, such as for carrying out a predetermined imaging gradient echo sequence. Control information, such as imaging parameters, as well as reconstructed magnetic resonance images, can be made available at a presentation unit, in the present case a display monitor 25 of the magnetic resonance apparatus 11 for a user. The magnetic resonance apparatus 11 has an input interface 26, by which information and/or parameters can be entered during a measurement process by a user. The calculation computer 24 can include the gradient control processor 28 and/or the radio frequency antenna control processor 29 and/or the display monitor 25 and/or the input interface 26.

The scanner 13 has a radio-frequency coil 37, which is designed for receiving magnetic resonance signals. For a magnetic resonance examination, the radio-frequency coil 37 is placed by a medical operator on a region of the body of the examination object 15 to be examined. In the present exemplary embodiment the radio-frequency coil 37 is formed as a body antenna. An embodiment of the radio-frequency coil 37 as a knee antenna unit and/or back antenna unit, etc. is also conceivable. It is also conceivable for more than one radio-frequency coil 37 to be positioned on the examination object 15. It is typical to use up to ten radio-frequency coils 37 to acquire the magnetic resonance signals. For clarity, the radio-frequency coil 37 is only shown schematically. In the case, shown it has three coil elements 39, but can have any suitable number of coil elements.

In the case shown, the calculation computer 24 has a determination unit 33, a generation unit 34 and a control unit 35. Thus, with the radio-frequency coil 37 and the calculation computer 24, the magnetic resonance apparatus 11 is designed for carrying out the inventive method.

The magnetic resonance apparatus 11 can of course have further components that magnetic resonance apparatuses usually have. The general functioning of the magnetic resonance apparatus 11 is known to those skilled in the art, so that a more detailed description of such further components is not necessary herein.

Figure 2:
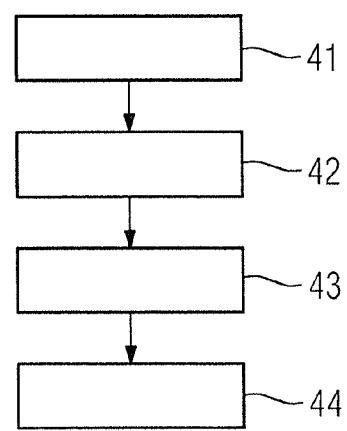
FIG. 2 is a flowchart of a first embodiment of the inventive method.

FIG. 2 shows a flowchart of a first embodiment of an inventive method for control of the magnetic resonance apparatus 11 for magnetic resonance imaging of the examination object 15.

In a first method step 41 the radio-frequency coil 37 of the magnetic resonance apparatus 11 detects a number of frequency spectra of a material of the examination object, wherein the at least one radio-frequency coil 37 has a number of coil elements 39 and at least two frequency spectra of the number of frequency spectra are detected by different coil elements 39 of the number of coil elements 39.

In a further method step 42 a number of resonant frequencies of at least one molecule in the number of frequency spectra are established by the determination unit 33 of the calculation computer 24.

In a further method step 43, control information is generated on the basis of the number of resonant frequencies established, by the generation processor 34 of the calculation computer 24.

In a further method step 44, the magnetic resonance scanner 13 is controlled on the basis of the control information by the control processor 35 of the calculation computer 24.

Figure 3:
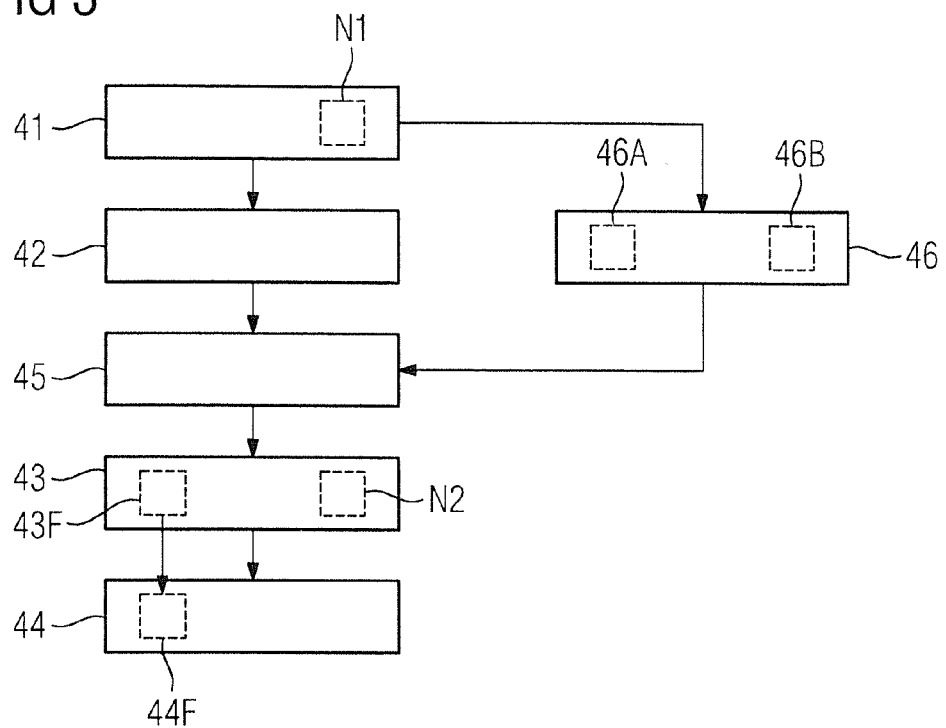
FIG. 3 is a flowchart of a second embodiment of the inventive method.

FIG. 3 shows a flowchart of a second embodiment of an inventive method for controlling a magnetic resonance apparatus 11 for magnetic resonance imaging of an examination object 15.

The description given below is essentially restricted to the differences from the exemplary embodiment in FIG. 2, wherein, for method steps which remain the same, the description of the exemplary embodiment in FIG. 2 applies. Method steps which essentially remain the same are basically given the same reference numbers.

The embodiment of the inventive method shown in FIG. 3 includes the method steps 41, 42, 43, 44 of the first form of embodiment of the inventive method according to FIG. 2. The second embodiment of the inventive method shown in FIG. 3 contains additional method steps and substeps. An alternate method sequence to that shown in FIG. 3 is also conceivable, which has only some of the additional method steps and/or substeps shown in FIG. 2. Naturally an alternate method sequence to that shown in FIG. 3 can also have additional method steps and/or substeps.

In a further method step 45, a merging of the number of resonant frequencies to a resulting resonant frequency of the at least one molecule is undertaken by the calculation computer 24. During the generation of the control information the number of resonant frequencies established can be included weighted with weighting factors. In the case shown the weighting factors are already included during the merging of the number of resonant frequencies in further method step 45. For this the weighting factors are determined in a further method step 46. Two different options 46A and 46B are shown for this, which can be used in combination or separately from one another. In accordance with a first option 46A at least one weighting factor of at least one resonant frequency of the number of resonant frequencies can be defined on the basis of at least one characteristic of the at least one frequency spectrum, in which the at least one resonant frequency is established. In accordance with a second option 46B at least one weighting factor of at least one resonant frequency of the number of resonant frequencies can be defined on the basis of a measure of deviation of the at least resonant frequency from further resonant frequencies of the number of resonant frequencies, which differ from the at least one resonant frequency. Naturally the weighting of the resonant frequencies with weighting factors can also be used during the generation of the control information in the method presented in FIG. 4 and FIG. 5.

The generation of the control information in further method step 43, in the case shown in FIG. 3, includes a generation of control information for a frequency adjustment in a substep 43F. Here the resulting resonant frequency established in further method step 45 can be included, for example set as frequency adjustment-control information. In further method step 44, in the control of the magnetic resonance scanner 13, the frequency is now adjusted in a substep 44F. Here the resulting resonant frequency can be used as a system frequency for example for irradiation of radio-frequency pulses and/or receipt of magnetic resonance signals.

In the case shown the condition is still fulfilled that the detection of the number of frequency spectra in further method step 41 comprises a detection of a first number N1 of frequency spectra and that a second number N2 of resonant frequencies are included in the generation of the control information in further method step 43, wherein the first number N1 is greater than the second number N2.

Figure 4:
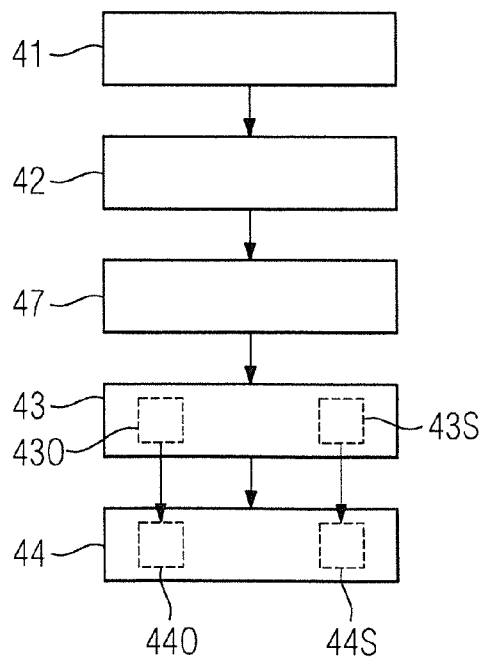
FIG. 4 is a flowchart of a third embodiment of the inventive method.

FIG. 4 shows a flowchart of a third embodiment of an inventive method for controlling a magnetic resonance apparatus 11 for magnetic resonance imaging of an examination object 15.

The description given below is essentially restricted to the differences from the exemplary embodiment in FIG. 2, wherein, for method steps which remain the same, the description of the exemplary embodiment in FIG. 2 applies. Method steps that essentially remain the same are basically given the same reference numbers.

The form of embodiment of the inventive method shown in FIG. 4 includes the method steps 41, 42, 43, 44 of the first embodiment of the inventive method according to FIG. 2. The embodiment of the inventive method shown in FIG. 4 contains additional method steps and substeps. An alternate method sequence to that shown in FIG. 4 is also conceivable, which has only some of the additional method steps and/or substeps shown in FIG. 2. Naturally an alternate method sequence to that shown in FIG. 4 can also have additional method steps and/or substeps.

In a further method step 47 a measure of the homogeneity of the basic magnetic field of the magnetic resonance scanner 13 is determined by the calculation computer 24, based on a distribution of values of the number of resonant frequencies. The control information is then generated in further method step 43 on the basis of the determined measure of the homogeneity of the basic magnetic field. Two options 43O, 43S are conceivable here, which can be used combined with one another or separately from one another.

In a first option 43O the generation of the control information on the basis of the defined measure of homogeneity of the basic magnetic field can be the generation of output information for a person operating the magnetic resonance scanner 13. Then, in a substep 44O of the further method step 44, the output information is presented to the operator on a display monitor 25.

In a second option 43S, the generation of the control information on the basis of the defined measure of homogeneity of the basic magnetic field is a generation of shim control information for the magnetic resonance data acquisition. Then, in a substep 44S of the further method step 44, a shim unit of the magnetic resonance apparatus 11 is activated for the magnetic resonance imaging by means of the shim control information.

FIG. 5 shows a flowchart of a fourth embodiment of an inventive method for controlling a magnetic resonance apparatus 11 for magnetic resonance imaging of an examination object 15.

The description given below is essentially restricted to the differences from the exemplary embodiment in FIG. 2, wherein, for method steps which remain the same, the description of the exemplary embodiment in FIG. 2 applies. Method steps that essentially remain the same are given the same reference numbers.

The embodiment of the inventive method shown in FIG. 5 includes the method steps 41, 42, 43, 44 of the first embodiment of the inventive method according to FIG. 2. The embodiment of the inventive method shown in FIG. 5 contains additional method steps and substeps. An alternate method sequence to that shown in FIG. 5 is also conceivable, which has only some of the additional method steps and/or substeps shown in FIG. 2. Naturally an alternate method sequence to that shown in FIG. 5 can also have additional method steps and/or substeps.

In a further method step 48, in the case shown, there is a calculation of a spatial distribution of a strength of a basic magnetic field of the magnetic resonance device by means of the calculation computer 24. In this case information about a spatial arrangement of the number of coil elements is included in the calculation of the spatial distribution of the strength of the basic magnetic field. In the case shown the spatial distribution of the strength of the basic magnetic field is calculated in a further method step 49. Here the local magnetic field strengths calculated for the number of resonant frequencies are assigned to a number of spatial support points, which are assigned to the number of coil elements.

The control information is then generated in further method step 43 using the calculated spatial distribution of the strength of the basic magnetic field. In the case shown shim settings are generated in a substep 43C of the further method step 43 on the basis of the calculated spatial distribution of the strength of the basic magnetic field. In a substep 44C of the further method step 44 a shim unit of the magnetic resonance apparatus 11 can then be activated by the shim settings. For example the shim settings include shim currents, by which shim coils of the shim unit are occupied during the magnetic resonance data acquisition.

The method steps of the inventive method shown in FIG. 2-4 are executed by the calculation computer 24. To this end the calculation computer 24 has required software and/or computer programs, which are stored in a memory unit of the calculation computer 24. The software and/or computer programs include program code designed to execute the inventive method when the computer program and/or the software is executed in the calculation computer 24.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for controlling a magnetic resonance (MR) apparatus comprising an MR scanner comprising a basic field magnet that produces a basic magnetic field in said MR scanner, and at least one radio-frequency (RF) coil comprising a plurality of coil elements, said method comprising:

operating the MR scanner to detect multiple frequency spectra of a material of an examination subject situated in the MR scanner, using said at least one radio-frequency coil, by detecting at least two frequency spectra of said multiple frequency spectra individually with respective, different coil elements of said plurality of coil elements;

providing the detected frequency spectra to a computer and, in said computer, determining, in said multiple frequency spectra, multiple resonant frequencies of at least one molecule of said material;

in said computer, calculating a spatial distribution of a strength of said basic magnetic field that includes information designating a spatial arrangement of said plurality of coil elements, said information comprising an allocation of local magnetic field strengths calculated from said multiple resonant frequencies, to a plurality of spatial support points that are respectively assigned to said plurality of coil elements;

in said computer, using said multiple resonant frequencies to formulate control information, using said calculated spatial distribution of the strength of the basic magnetic field, designed to operate said MR scanner; and emitting an electronic signal, in which said control information is represented, in a signal format for operating said MR scanner.

2. A method as claimed in claim 1 comprising, in said computer, merging said multiple resonant frequencies into one resulting resonant frequency of said at least one molecule, and formulating said control information as frequency adjustment control information to implement a frequency adjustment of said MR scanner using said resulting resonant frequency.

3. A method as claimed in claim 1 wherein said MR scanner comprises a basic field magnet that produces a basic magnetic field, and wherein said method comprises:
in said computer, determining a distribution of values of said multiple resonant frequencies;
from said distribution of values of said multiple resonant frequencies, determining a measure of a homogeneity of said basic magnetic field; and
formulating said control information dependent on said measure of homogeneity of said basic magnetic field.

4. A method as claimed in claim 3 comprising formulating said control information based on said measure of said homogeneity of said basic magnetic field to include output information dependent on said homogeneity, and displaying said output information visually to operating personnel of said MR scanner.

5. A method as claimed in claim 3 comprising generating said control information dependent on said homogeneity of said basic magnetic field to include shim control information for shimming said MR scanner.

6. A method as claimed in claim 1 comprising formulating said control information using said calculated spatial distribution of the strength of the basic magnetic field to include a calculation of shim settings, using said support points, to operate shim coils of said MR scanner.

7. A method for controlling a magnetic resonance (MR) apparatus comprising an MR scanner comprising at least one radio-frequency (RF) coil comprising a plurality of coil elements, said method comprising:
operating the MR scanner to detect multiple frequency spectra of a material of an examination subject situated in the MR scanner, using said at least one radio-frequency coil, by detecting at least two frequency spectra of said multiple frequency spectra individually with respective, different coil elements of said plurality of coil elements;
providing the detected frequency spectra to a computer and, in said computer, determining, in said multiple frequency spectra, multiple resonant frequencies of at least one molecule of said material;
in said computer, using said multiple resonant frequencies to formulate control information designed to operate said MR scanner;
in said computer, giving respective resonant frequencies in said multiple resonant frequencies respective weighting factors, with at least one weighting factor of at least one resonant frequency in said multiple resonant frequencies being defined dependent on at least one characteristic of at least one frequency spectrum in said multiple frequency spectra;
formulating said control information with said multiple resonant frequencies being weighted with said respective weighting factors; and
emitting an electronic signal, in which said control information is represented, in a signal format for operating said MR scanner.

8. A method for controlling a magnetic resonance (MR) apparatus comprising an MR scanner comprising at least one radio-frequency (RF) coil comprising a plurality of coil elements, said method comprising:
operating the MR scanner to detect multiple frequency spectra of a material of an examination subject situated in the MR scanner, using said at least one radio-frequency coil, by detecting at least two frequency spectra of said multiple frequency spectra individually with respective, different coil elements of said plurality of coil elements;
providing the detected frequency spectra to a computer and, in said computer, determining, in said multiple frequency spectra, multiple resonant frequencies of at least one molecule of said material;
in said computer, using said multiple resonant frequencies to formulate control information designed to operate said MR scanner;
in said computer, weighting respective resonant frequencies in said multiple resonant frequencies with respective weighting factors, and determining a weighting factor of at least one resonant frequency in said multiple resonant frequencies dependent on a deviation of said at least one resonant frequency from other resonant frequencies in said multiple resonant frequencies;
formulating said control information with said multiple resonant frequencies being respectively weighted with said respective weighting factors; and
emitting an electronic signal, in which said control information is represented, in a signal format for operating said MR scanner.

9. A method for controlling a magnetic resonance (MR) apparatus comprising an MR scanner comprising at least one radio-frequency (RF) coil comprising a plurality of coil elements, said method comprising:
operating the MR scanner to detect multiple frequency spectra of a material of an examination subject situated in the MR scanner, using said at least one radio-frequency coil, by detecting at least two frequency spectra of said multiple frequency spectra individually with respective, different coil elements of said plurality of coil elements;
providing the detected frequency spectra to a computer and, in said computer, determining, in said multiple frequency spectra, multiple resonant frequencies of at least one molecule of said material;
in said computer, using said multiple resonant frequencies to formulate control information designed to operate said MR scanner;
detecting said multiple frequency spectra by detecting a first number of frequency spectra;
formulating said control information using a second number of said multiple resonant frequencies, wherein said first number is larger than said second number; and
emitting an electronic signal, in which said control information is represented, in a signal format for operating said MR scanner.

10. A magnetic resonance (MR) apparatus comprising:
an MR scanner comprising a basic field magnet that produces a basic magnetic field in said MR scanner, and at least one radio-frequency (RF) coil comprised of a plurality of coil elements;
a control computer configured to operate the MR scanner to detect multiple frequency spectra of a material of an examination subject situated in the MR scanner, using said at least one radio-frequency coil, by detecting at least two frequency spectra of said multiple frequency spectra individually with respective, different coil elements of said plurality of coil elements;
said control computer being configured to determine, in said multiple frequency spectra, multiple resonant frequencies of at least one molecule of said material;

said computer being configured to calculate a spatial distribution of a strength of said basic magnetic field that includes information designating a spatial arrangement of said plurality of coil elements, said information comprising an allocation of local magnetic field strengths calculated from said multiple resonant frequencies, to a plurality of spatial support points that are respectively assigned to said plurality of coil elements;

said control computer being configured to use said multiple resonant frequencies to formulate control information using said calculated spatial distribution of the strength of the basic magnetic field designed to operate said MR scanner; and said control computer being configured to emit an electronic signal, in which said control information is represented, to said MR scanner, and to operate said MR scanner according to said control information.

11. A non-transitory, computer-readable data storage medium encoded with programming instructions, said storage medium being loaded into a control computer of a magnetic resonance (MR) apparatus that comprises an MR scanner comprising at least one radio-frequency (RF) coil comprising a plurality of coil elements, said programming instructions causing said control computer to:

operate the MR scanner to detect multiple frequency spectra of a material of an examination subject situated in the MR scanner, using said at least one radio-frequency coil, by detecting at least two frequency spectra of said multiple frequency spectra individually with respective, different coil elements of said plurality of coil elements;

determine, in said multiple frequency spectra, multiple resonant frequencies of at least one molecule of said material;

use said multiple resonant frequencies to formulate control information designed to operate said MR scanner;

weight the respective resonant frequencies in said multiple resonant frequencies with respective weighting factors, and determine a weighting factor of at least one resonant frequency in said multiple resonant frequencies dependent on a deviation of said at least one resonant frequency from other resonant frequencies in said multiple resonant frequencies;

formulate said control information with said multiple resonant frequencies being respectively weighted with said respective weighting factors; and emit an electronic signal, in which said control information is represented, from said control computer in a signal format for operating said MR scanner.

12. A magnetic resonance (MR) apparatus comprising:
an MR scanner comprising at least one radio-frequency (RF) coil comprised of a plurality of coil elements;
a control computer configured to operate the MR scanner to detect multiple frequency spectra of a material of an examination subject situated in the MR scanner, using said at least one radio-frequency coil, by detecting at least two frequency spectra of said multiple frequency spectra individually with respective, different coil elements of said plurality of coil elements;

said control computer being configured to determine, in said multiple frequency spectra, multiple resonant frequencies of at least one molecule of said material;

said control computer being configured to use said multiple resonant frequencies to formulate control information designed to operate said MR scanner;

said control computer being configured to give respective resonant frequencies in said multiple resonant frequencies respective weighting factors, with at least one weighting factor of at least one resonant frequency in said multiple resonant frequencies being defined dependent on at least one characteristic of at least one frequency spectrum in said multiple frequency spectra;

said control computer being configured to formulate said control information with said multiple resonant frequencies being weighted with said respective weighting factors; and said control computer being configured to emit an electronic signal, in which said control information is represented, to said MR scanner, and to operate said MR scanner according to said control information.

13. A non-transitory, computer-readable data storage medium encoded with programming instructions, said storage medium being loaded into a control computer of a magnetic resonance (MR) apparatus that comprises an MR scanner comprising at least one radio-frequency (RF) coil comprising a plurality of coil elements, said programming instructions causing said control computer to:

operate the MR scanner to detect multiple frequency spectra of a material of an examination subject situated in the MR scanner, using said at least one radio-frequency coil, by detecting at least two frequency spectra of said multiple frequency spectra individually with respective, different coil elements of said plurality of coil elements;

determine, in said multiple frequency spectra, multiple resonant frequencies of at least one molecule of said material;

use said multiple resonant frequencies to formulate control information designed to operate said MR scanner;

detect said multiple frequency spectra by detecting a first number of frequency spectra;

formulate said control information using a second number of said multiple resonant frequencies, wherein said first number is larger than said second number; and emit an electronic signal, in which said control information is represented, from said control computer in a signal format for operating said MR scanner.

* * * * *